(12) United States Patent
Lam et al.

(10) Patent No.: US 9,825,094 B2
(45) Date of Patent: *Nov. 21, 2017

(54) FINFET PCM ACCESS TRANSISTOR HAVING GATE-WRAPPED SOURCE AND DRAIN REGIONS

(71) Applicant: GLOBALFOUNDRIES INC., Grand Cayman (KY)

(72) Inventors: Chung H. Lam, Peekskill, NY (US); Chung-Hsun Lin, White Plains, NY (US); Darsen D. Lu, Mount Kisco, NY (US); Philip J. Oldiges, Lagrangeville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/953,702

(22) Filed: Nov. 30, 2015

(65) Prior Publication Data

US 2017/0054005 A1    Feb. 23, 2017

Related U.S. Application Data

(63) Continuation of application No. 14/832,108, filed on Aug. 21, 2015.

(51) Int. Cl.
*H01L 29/66* (2006.01)
*H01L 27/24* (2006.01)
(Continued)

(52) U.S. Cl.
CPC .... *H01L 27/2436* (2013.01); *H01L 21/31105* (2013.01); *H01L 21/823431* (2013.01);
(Continued)

(58) Field of Classification Search
None
See application file for complete search history.

(56) References Cited

U.S. PATENT DOCUMENTS 7,371,627 B1 * 5/2008 Forbes .............. H01L 27/10876
257/328
7,491,995 B2 * 2/2009 Forbes .................. B82Y 10/00
257/296

(Continued)

OTHER PUBLICATIONS

Mueller et al., "Challenges for the DRAM Cell Scaling to 40nm," IEEE International Electron Devices Meeting, IEDM, 2005, 4 pages.

(Continued)

*Primary Examiner* — Michael Lebentritt
*Assistant Examiner* — Jordan Klein
(74) *Attorney, Agent, or Firm* — Michael Le Strange; Hoffman Warnick LLC

(57) ABSTRACT

Embodiments are directed to a method of forming portions of a fin-type field effect transistor (FinFET) device. The method includes forming at least one source region having multiple sides, forming at least one drain region having multiple sides, forming at least one channel region having multiple sides, forming at least one gate region around the multiple sides of the at least one channel region and forming the at least one gate region around the multiple sides of the at least one drain region.

15 Claims, 13 Drawing Sheets

(51) Int. Cl.
   *H01L 21/311*   (2006.01)
   *H01L 21/8234*  (2006.01)
   *H01L 29/423*   (2006.01)
   *H01L 29/78*    (2006.01)
   *H01L 45/00*    (2006.01)
   *H01L 29/417*   (2006.01)
   *H01L 29/08*    (2006.01)

(52) U.S. Cl.
   CPC .. *H01L 21/823456* (2013.01); *H01L 29/0847* (2013.01); *H01L 29/41791* (2013.01); *H01L 29/42376* (2013.01); *H01L 29/66795* (2013.01); *H01L 29/66803* (2013.01); *H01L 29/785* (2013.01); *H01L 45/06* (2013.01)

(56) References Cited

U.S. PATENT DOCUMENTS

| | | | | |
|---|---|---|---|---|
| 7,566,620 | B2* | 7/2009 | Abbott | H01L 27/10823 257/296 |
| 7,605,028 | B2* | 10/2009 | Mouli | H01L 27/108 257/E21.32 |
| 8,138,574 | B2* | 3/2012 | Chen | H01L 27/2445 257/1 |
| 8,350,316 | B2* | 1/2013 | Lung | H01L 27/101 257/328 |
| 8,415,651 | B2* | 4/2013 | Lung | H01L 45/1691 257/2 |
| 8,557,657 | B1* | 10/2013 | Basker | H01L 27/0629 257/296 |
| 2007/0082448 | A1* | 4/2007 | Kim | H01L 27/10876 438/268 |
| 2007/0181942 | A1 | 8/2007 | Knoblinger et al. | |
| 2007/0231980 | A1* | 10/2007 | Forbes | B82Y 10/00 438/157 |
| 2007/0231985 | A1* | 10/2007 | Forbes | H01L 27/105 438/197 |
| 2007/0232007 | A1* | 10/2007 | Forbes | B82Y 10/00 438/301 |
| 2013/0148409 | A1 | 6/2013 | Chung et al. | |
| 2013/0153851 | A1* | 6/2013 | Park | H01L 43/08 257/4 |
| 2014/0061792 | A1* | 3/2014 | Bu | H01L 29/66795 257/347 |
| 2015/0263136 | A1* | 9/2015 | Hsiao | H01L 29/66795 257/401 |
| 2015/0295087 | A1* | 10/2015 | Cheng | H01L 29/7851 257/192 |
| 2015/0325597 | A1* | 11/2015 | Zhang | H01L 27/1211 257/348 |
| 2017/0092756 | A1* | 3/2017 | Lai | H01L 29/785 |

OTHER PUBLICATIONS

Mueller et al., "Future memory technologies," SPIE Europe Microtechnologies for the New Millennium, International Society for Optics and Photonic, Proc. of SPIE, vol. 7363, 2009, 736302, 13 pages.

* cited by examiner

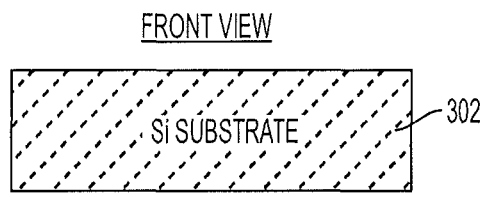
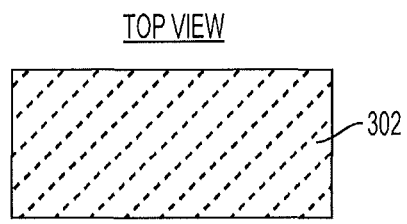
FIG. 3A     FIG. 3B
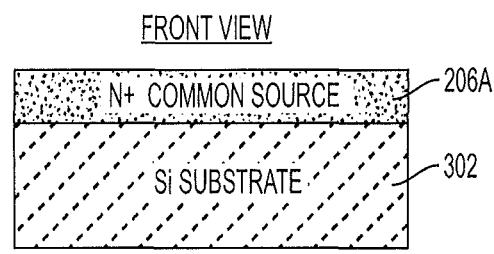
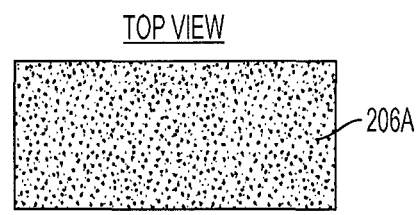
FIG. 4A     FIG. 4B
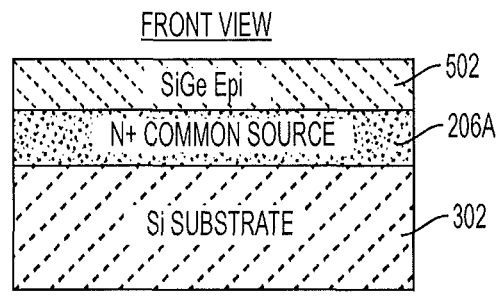
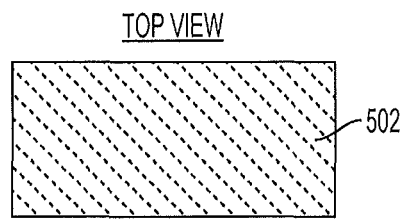
FIG. 5A     FIG. 5B

FRONT VIEW

TOP VIEW

FRONT VIEW

TOP VIEW

FINFET PCM ACCESS TRANSISTOR HAVING GATE-WRAPPED SOURCE AND DRAIN REGIONS

DOMESTIC PRIORITY

The present application claims priority to U.S. Non-provisional application Ser. No. 14/832,108 filed on Aug. 21, 2015 titled "FINET PCM ACCESS TRANSISTOR HAVING GATE-WRAPPED SOURCE AND DRAIN REGIONS," assigned to the assignee hereof and expressly incorporated by reference herein

BACKGROUND

The present disclosure relates in general to semiconductor device structures and their fabrication. More specifically, the present disclosure relates to the fabrication of a fin-type field effect transistor (FinFET) having a gate region wrapped around moderately doped source and drain regions.

Phase change memory (PCM) is a non-volatile solid-state memory technology built around the large electrical contrast between the highly-resistive amorphous and highly-conductive crystalline states in so-called phase change materials. For high density PCM technologies, it is necessary to use nanometer scaled access transistor configurations having relatively short channels. A FinFET device can be scaled to nanometer dimensions and provides a short channel appropriate for use as the access transistors for high density PCM cells. Because a relatively shorter channel is more susceptible to leakage currents, moderate doping of the FinFET source and drain regions may be provided to suppress leakage current of unselected FinFET cells during read and programming conditions. However, moderate doping of the FinFET source and drain regions results in high parasitic resistance in the source and drain regions, which degrades access transistor drive current.

SUMMARY

Embodiments are directed to a method of forming portions of a fin-type field effect transistor (FinFET) device. The method includes forming at least one source region having multiple sides, forming at least one drain region having multiple sides, forming at least one channel region having multiple sides, forming at least one gate region around the multiple sides of the at least one channel region and forming the at least one gate region around the multiple sides of the at least one drain region.

Embodiments are further directed to a method of forming portions of a FinFET device. The method includes forming at least one source region having multiple sides, forming at least one drain region having multiple sides, forming at least one channel region having multiple sides, forming at least one gate region around the multiple sides of the at least one channel region, forming the at least one gate region around the multiple sides of the at least one drain region and forming the at least one gate region around the multiple sides of the at least one source region.

Embodiments are further directed to a FinFET device including at least one source region having multiple sides, at least one drain region having multiple sides, at least one channel region having multiple sides, at least one gate region formed around the multiple sides of the at least one channel region and the at least one gate region further formed around the multiple sides of the at least one drain region.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIG. 3A depicts a two-dimensional, cut-away view of a front plane during an initial fabrication stage of a portion of a PCM memory having FinFET semiconductor devices according to one or more embodiments;

FIG. 3B depicts a two-dimensional, cut-away view of a top plane of the portion of the PCM memory semiconductor device shown in FIG. 3A;

FIG. 4A depicts a two-dimensional, cut-away view of a front plane during an intermediate fabrication stage of a portion of a PCM memory having FinFET semiconductor devices according to one or more embodiments;

FIG. 4B depicts a two-dimensional, cut-away view of a top plane of the portion of the PCM memory semiconductor device shown in FIG. 4A;

FIG. 5A depicts a two-dimensional, cut-away view of a front plane during an intermediate fabrication stage of a portion of a PCM memory having FinFET semiconductor devices according to one or more embodiments;

FIG. 5B depicts a two-dimensional, cut-away view of a top plane of the portion of the PCM memory semiconductor device shown in FIG. 5A;

DETAILED DESCRIPTION

It is understood in advance that although this disclosure includes a detailed description of an exemplary FinFET configuration, implementation of the teachings recited herein are not limited to the particular FinFET structure disclosed herein. Rather, embodiments of the present disclosure are capable of being implemented in conjunction with any other type of fin-based transistor device now known or later developed. Additionally, although disclosed embodiments focus on n-type doping, the teachings of the present disclosure apply equally to p-type doping as well.

When on the order of one dopant atom is added to a semiconductor material per 100 million atoms, the doping is said to be moderate or low or light. When many more dopant atoms are added to a semiconductor material, on the order of one per 10,000 atoms, the doping is referred to as heavy or high. Heavy doping is often shown as N+ for n-type doping or P+ for p-type doping.

For the sake of brevity, conventional techniques related to FinFET semiconductor device fabrication may not be described in detail herein. Moreover, the various tasks and process steps described herein may be incorporated into a more comprehensive procedure or process having additional steps or functionality not descried in detail herein. In particular, various steps in the manufacture of semiconductor based transistors are well known and so, in the interest of brevity, many conventional steps will only be mentioned briefly herein or will be omitted entirely without providing the well-known process details.

By way of background, typical semiconductor devices are formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

Figure 1:
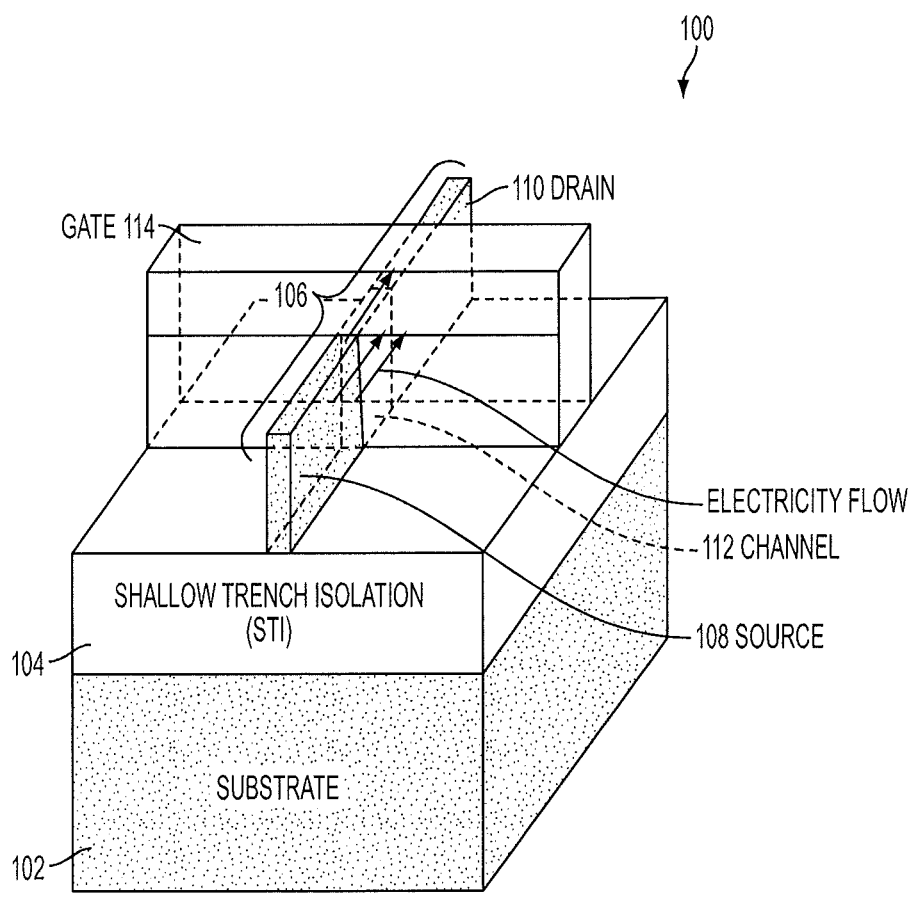
FIG. 1 depicts a three-dimensional view of an exemplary configuration of a known FinFET device.

One particularly advantageous type of MOSFET is known generally as a fin-type field effect transistor (FinFET). FIG. 1 depicts a three-dimensional view of an exemplary FinFET 100, which includes a shallow trench isolation (STI) region 104 for isolation of active areas from one another. The basic electrical layout and mode of operation of FinFET 100 do not differ significantly from a traditional field effect transistor. FinFET 100 includes a semiconductor substrate 102, local STI region 104, a fin 106, and a gate 114 having a gate oxide layer (not shown) between the gate and the fin, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on local STI region 104 and substrate 102. Substrate 102 may be silicon, and local STI region 104 may be an oxide (e.g., $SiO_2$). Fin 106 may be silicon. Gate 114 controls the source to drain current flow (labeled ELECTRICITY FLOW in FIG. 1).

In contrast to a planar MOSFET, however, source 108, drain 110 and channel 112 are built as a three-dimensional bar on top of local STI region 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The source and drain regions may be suitably doped to produce the desired FET polarity, as is known in the art. The dimensions of the fin establish the effective channel length for the transistor.

As previously noted herein, PCM is a non-volatile solid-state memory technology built around the large electrical contrast between the highly-resistive amorphous and highly-conductive crystalline states in so-called phase change materials. For high density PCM technologies, it is necessary to use nanometer scaled access transistor configurations having relatively short channels. A FinFET device can be scaled to nanometer dimensions and provides a short channel appropriate for use as the access transistors for high density PCM cells. Because a relatively shorter channel is more susceptible to leakage currents, moderate doping of the FinFET source and drain regions may be provided to suppress leakage current of unselected FinFET cells during read and programming conditions. However, moderately doping the FinFET source and drain regions results in high parasitic resistance in the source and drain regions, which degrades access transistor drive current.

Accordingly, the present disclosure provides FinFET device structures and fabrication methodologies, wherein a gate region of the FinFET is wrapped around moderately doped drain regions and/or moderately doped source regions of the FinFET. To turn a FinFET transistor on and drive current from the source through the channel to the drain, series resistance of the source/channel/drain current path must be overcome. A higher series resistance requires a higher device drive current. In PCM applications, wherein moderate doping of the FinFET source and drain regions is provided in order to suppress the leakage current of unselected FinFET cells during read and programming conditions, the moderate doping of the FinFET source and drain regions results in high parasitic resistance in the source and drain regions, which degrades access transistor drive current.

The metal gate induces electrons and holes in the surface of adjacent silicon material when the metal gate is turned on, but does not induce electrons and holes in the surface of adjacent silicon material when the metal gate is turned off. These induced electrons and holes can serve as transport charges that reduce the resistance of the adjacent silicon material. Wrapping the metal gate around the moderately doped source/drain regions induces even more electrons and holes in the surface of adjacent silicon material when the metal gate is turned on, but still does not induce electrons and holes in the surface of adjacent silicon material when the metal gate is turned off. These additional induced electrons and holes can also serve as transport charges that even further reduce the resistance of the adjacent silicon material. Further, wrapping the metal gate around the moderately doped source/drain regions help to reduce series resistance leakage currents. In one or more embodiments, wrapping of gate around the source and drain can be achieved by a fabrication methodology that adds only one extra oxide etching step before the replacement metal gate is deposited into the gate trench. According to one or more embodiments of the present disclosure, by wrapping the gate around the source and drain contacts, drive current is improved by two times or more for a given off-state leakage.

Figure 2A:
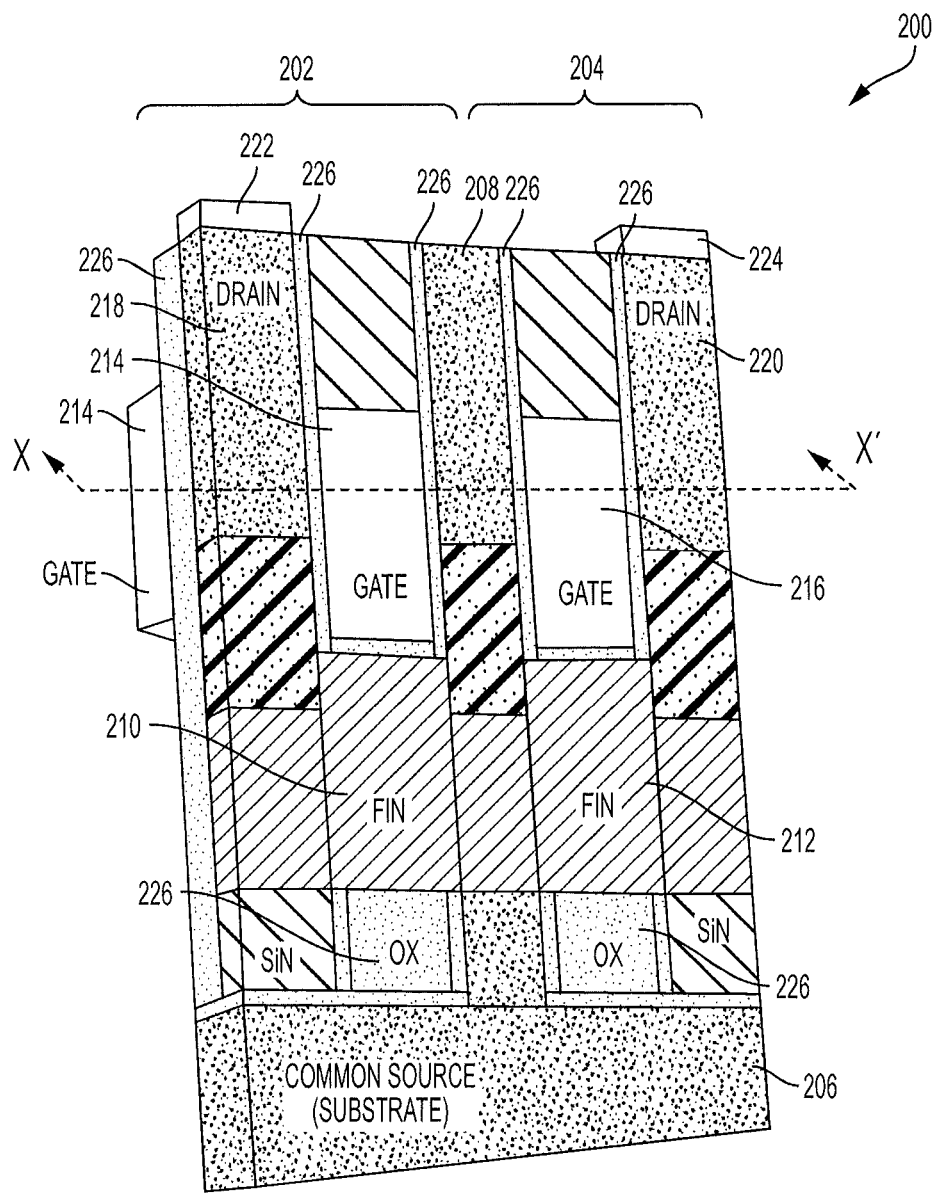
FIG. 2A depicts a three-dimensional cut away view of an exemplary portion of a PCM memory having two FinFET devices configured according to one or more embodiments.

Turning now to a more detailed description of one or more embodiments of the present disclosure, FIG. 2A depicts a three-dimensional cut away view of an exemplary portion of a PCM memory 200 having two FinFET devices 202, 204 configured according to one or more embodiments. PCM portion 200 is a cut away view taken along a front plane 240 (shown in FIG. 2B), such that PCM portion 200 is one half of a complete PCM section (now shown). The complete PCM section includes PCM portion 200 and a mirror image (not shown) of PCM portion 200. For ease of illustration and explanation, only PCM portion 200 (i.e., one half of the complete PCM section) is shown. However, it is intended that all illustrations and explanations of PCM portion 200 apply equally to the mirror image thereof (not shown). PCM portion 200 includes front plane 240, a back plane 242 (shown in FIG. 2C) a common source substrate region 206, a shared source pillar region 208, a first fin/channel pillar region 210, a second fin/channel pillar region 212, a first gate region 214, a second gate region 216, a first drain pillar region 218, a second drain pillar region 220, a first drain contact 222 and a second drain contact 224, configured and arranged as shown. FinFET 202 is formed from shared source pillar region 208, first fin/channel pillar region 210, first gate region 214 and first drain pillar region 218. FinFET 204 is formed from shared source pillar region 208, second fin/channel pillar region 212, second gate region 216 and second drain pillar region 220. Dielectric regions/layers 226, which may be formed from $SiO_2$, are provided throughout PCM portion 200 to isolate FinFETs 202, 204.

A bias voltage on first gate region 214 causes current to flow up from common source substrate region 206 through shared source pillar region 208 then move left through first fin/channel pillar 210 and up through first drain pillar region 218. Similarly, a bias voltage on second gate region 216 causes current to flow up from common source substrate region 206 through shared source pillar region 208 then move right through second fin/channel pillar 212 and up through second drain pillar region 220. For more effective control over first and second fin/channel pillar regions 210, 212, first and second gate regions each extend from front plane 240 toward back plane 242, around first and second fin/channel pillar regions 210, 212, respectively, then back toward front plane 240 to locations just behind isolation dielectric regions/layers 226 just above common source substrate region 206.

Figure 2B:
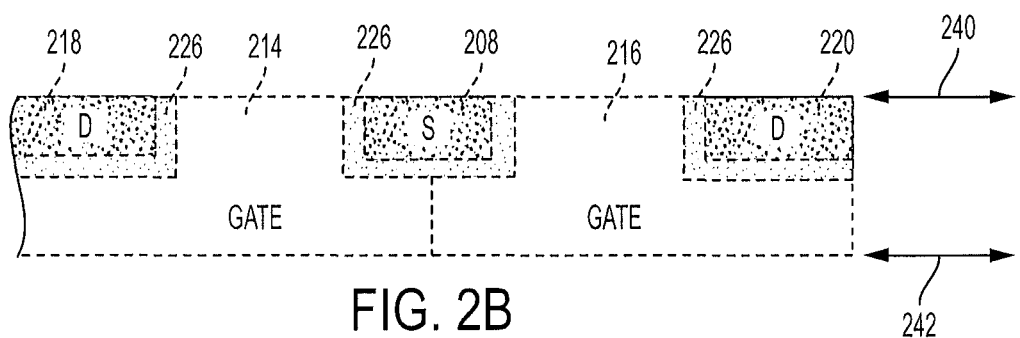
FIG. 2B depicts a cross sectional view taken along line X-X' of FIG. 2A according to an embodiment.
Figure 2C:
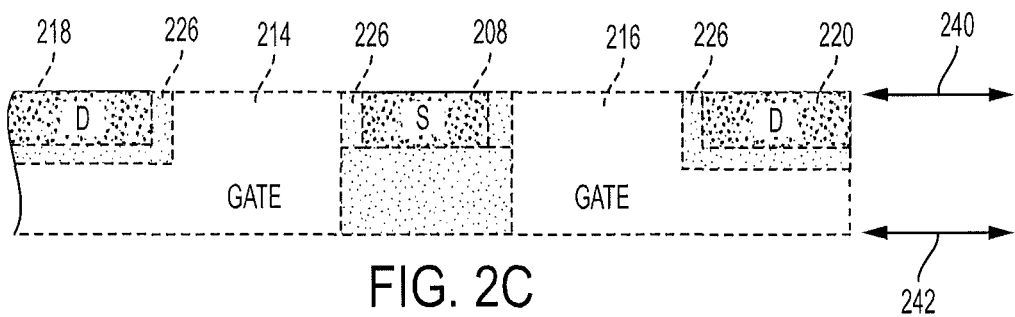
FIG. 2C depicts a cross sectional view taken along line X-X' of FIG. 2A according to another embodiment.

FIG. 2B depicts a cross sectional view of PCM 200 taken along line X-X' of FIG. 2A according to an embodiment, and FIG. 2C depicts another cross sectional view taken along line X-X' of FIG. 2A according to another embodiment. In both embodiments, first gate region 214 wraps around first drain/pillar region 218, and second gate region 216 wraps around second drain/pillar region 220. In the embodiment shown in FIG. 2B, first and second gate regions also combine to wrap around shared source pillar region 208. As noted previously herein, a complete PCM section includes PCM portion 200 and a mirror image thereof. Accordingly, each embodiment shown in FIGS. 2B and 2C includes a mirror image (not shown).

A fabrication methodology for forming various stages of a PCM portion 200A (shown in FIG. 14B) in accordance with one or more embodiments of the present disclosure will now be described with reference to FIGS. 3A-15. More specifically, FIGS. 3A-14B illustrate PCM portion 200A after various fabrication stages, and FIG. 15 depicts various operations of a fabrication methodology 1500 that corresponds to the fabrication stages shown in FIGS. 3A-14B. Additionally, FIGS. 3A, 4A, 5A, 6A, 7A, 8A, 9A, 10A, 11A, 12A, 13A and 14A depict front views of the various fabrication stages of PCM portion 200A, and FIGS. 3B, 4B, 5B, 6B, 7B, 8B, 9B, 10B, 11B, 12B, 13B and 14B depict top views of the various fabrication stages of PCM portion 200A. The following description will refer simultaneously to both the fabrication stages depicted in FIGS. 3A-14B and the corresponding operation(s) of methodology 1500 depicted in FIG. 15.

Figure 6A:
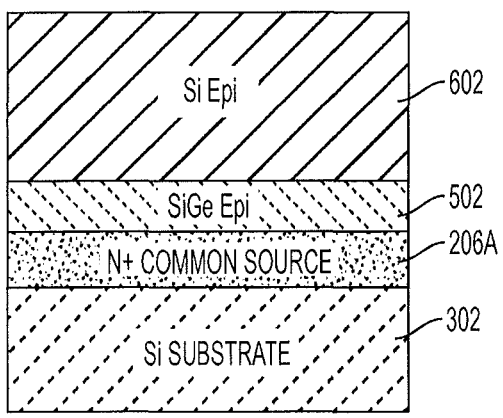
FIG. 6A depicts a two-dimensional, cut-away view of a front plane during an intermediate fabrication stage of a portion of a PCM memory having FinFET semiconductor devices according to one or more embodiments.
Figure 6B:
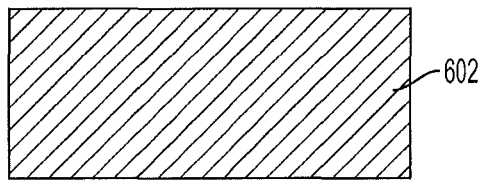
FIG. 6B depicts a two-dimensional, cut-away view of a top plane of the portion of the PCM memory semiconductor device shown in FIG. 6A.

In FIGS. 3A and 3B (block 1502 of methodology 1500), a substrate 302 is formed from silicon (Si) using known fabrication methods. In FIGS. 4A and 4B (block 1504 of methodology 1500), an N+ common source layer 206A is formed on substrate 302 by deposition or by doping a top portion of substrate 302. In FIGS. 5A and 5B (block 1506 of methodology 1500), a sacrificial layer 502 (e.g., a silicon germanium (SiGe) layer) is epitaxially grown N+ common source layer 206A. In FIGS. 6A and 6B (block 1508 of methodology 1500), a Si layer 602 is epitaxially grown on sacrificial layer 502.

Figure 7A:
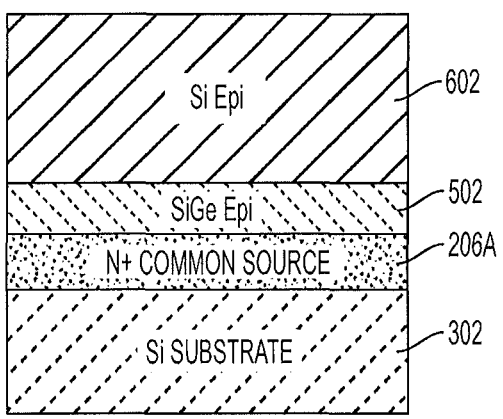
FIG. 7A depicts a two-dimensional, cut-away view of a front plane during an intermediate fabrication stage of a portion of a PCM memory having FinFET semiconductor devices according to one or more embodiments.
Figure 7B:
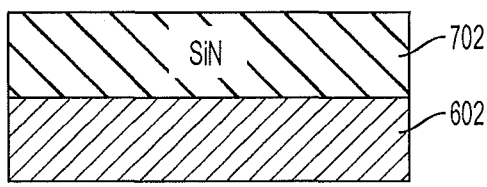
FIG. 7B depicts a two-dimensional, cut-away view of a top plane of the portion of the PCM memory semiconductor device shown in FIG. 7A.

As best shown in FIG. 7B (block 1510 of methodology 1500), Si layer 602 is patterned with a photo-resist such that a back side of Si layer 602 is exposed. This exposed back side portion of Si layer 602 is etched through Si layer 602 and sacrificial layer 502 to form a trench that is subsequently filled with a nitride 702 (e.g., SiN) back to the same level as Si layer 602.

Figure 8A:
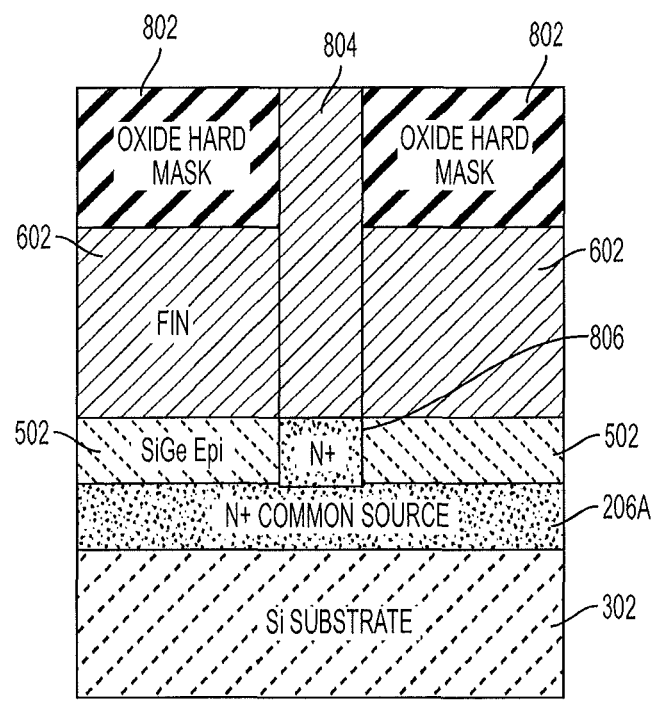
FIG. 8A depicts a two-dimensional, cut-away view of a front plane during an intermediate fabrication stage of a portion of a PCM memory having FinFET semiconductor devices according to one or more embodiments.
Figure 8B:
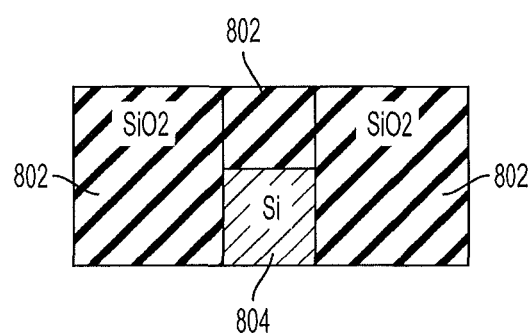
FIG. 8B depicts a two-dimensional, cut-away view of a top plane of the portion of the PCM memory semiconductor device shown in FIG. 8A.
Figure 14A:
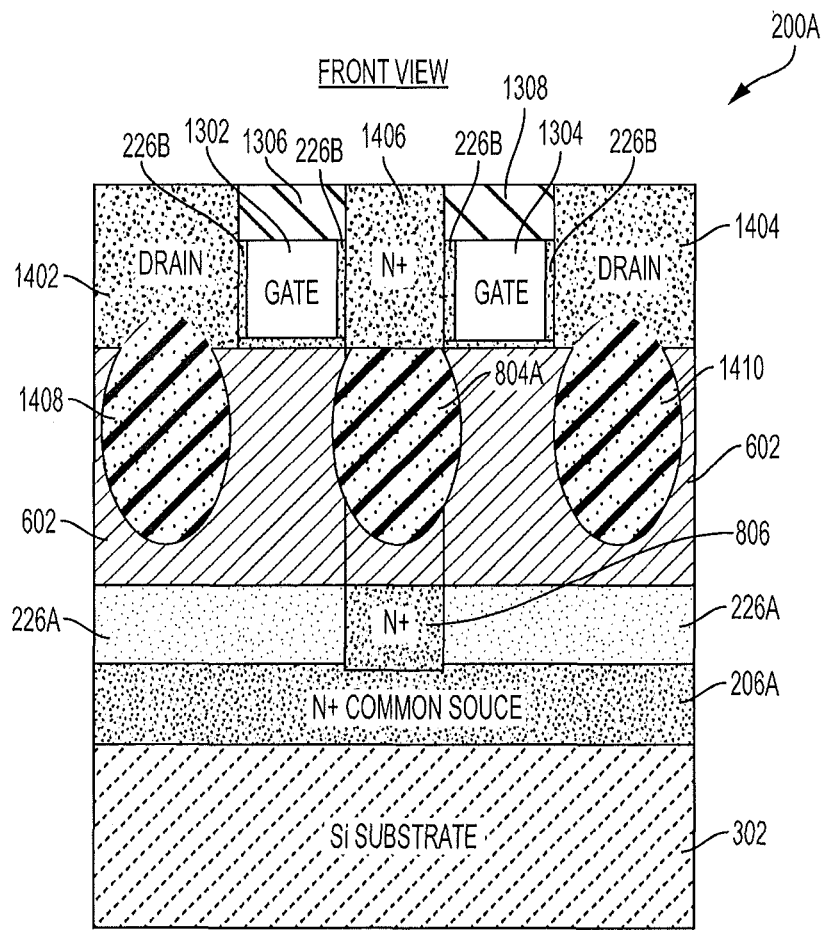
FIG. 14A depicts a two-dimensional, cut-away view of a front plane during a near final fabrication stage of a portion of a PCM memory having FinFET semiconductor devices according to one or more embodiments.
Figure 14B:
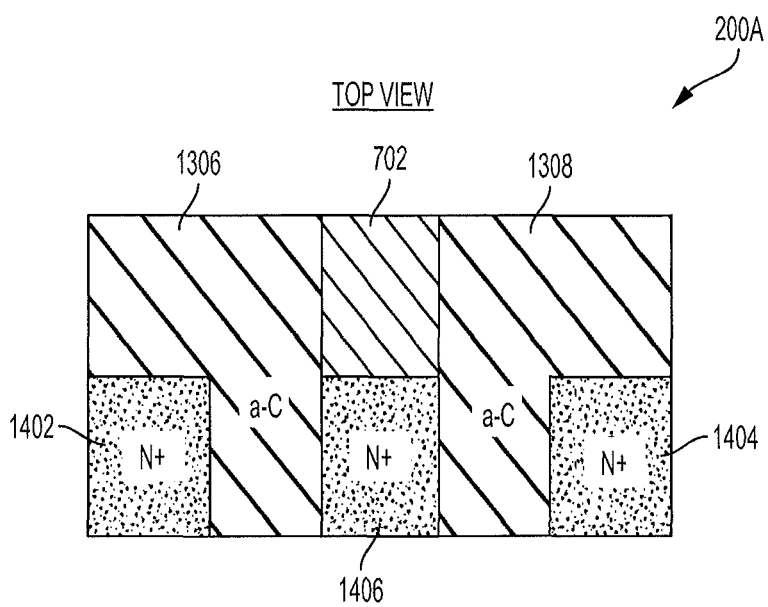
FIG. 14B depicts a two-dimensional, cut-away view of a top plane of the portion of the PCM memory semiconductor device shown in FIG. 14A.
Figure 15:
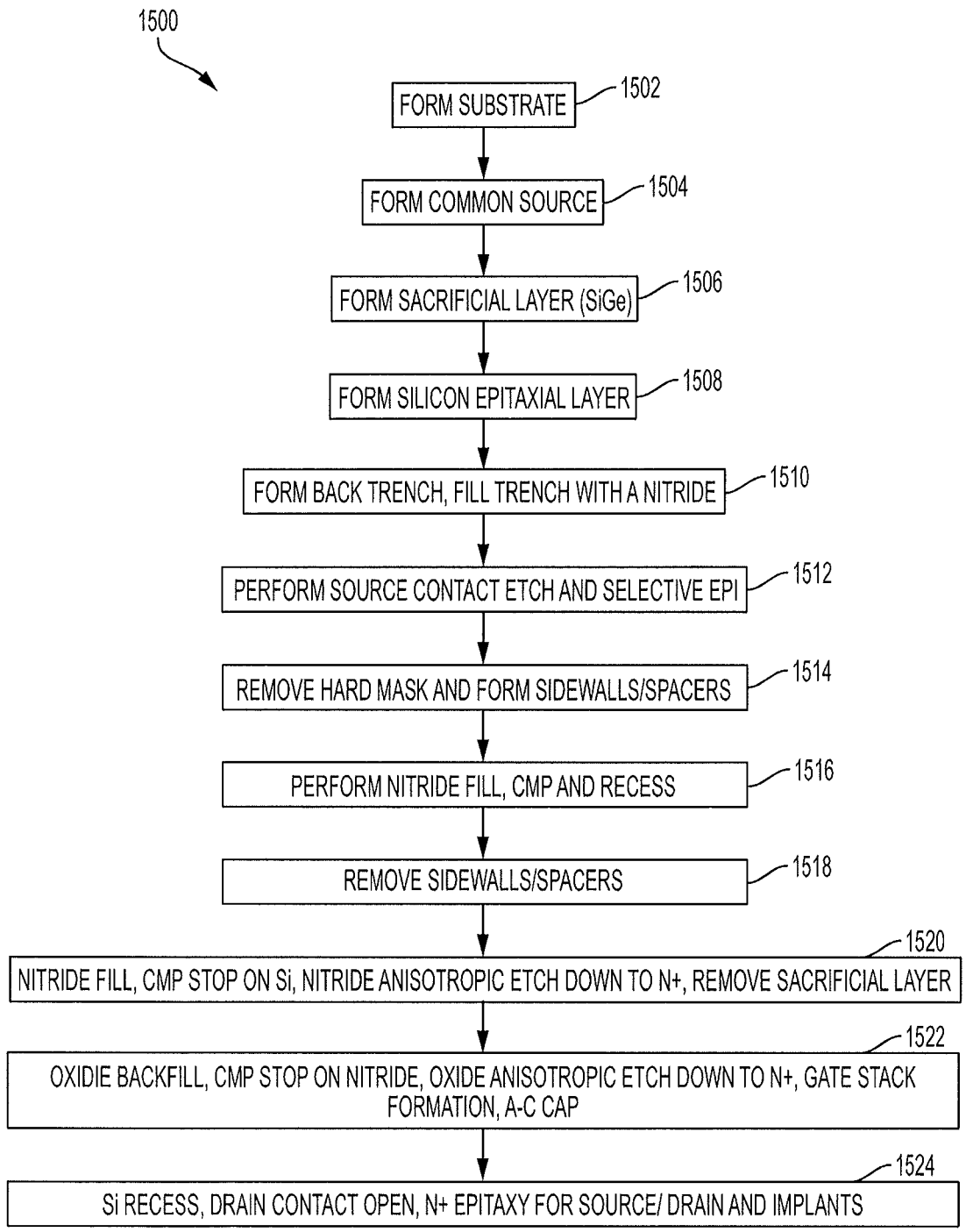
FIG. 15 is a flow diagram illustrating a methodology according to one or more embodiments.

In FIGS. 8A and 8B (block 1512 of methodology 1500), an oxide hard mask layer 802 (e.g., SiO$_2$) is formed over Si layer 602 in a pattern to expose a square section that will be etched then re-grown to form a shared source region 804 of PCM portion 200A (shown in FIG. 14B). More specifically, the exposed square section of Si layer 602 is etched down through Si layer 602 and sacrificial layer 502 down to N+ common source layer 20A. A silicon epitaxial growth process is used to grow an N+ common source connector region 806 on top of N+ common source layer 206A. Another silicon epitaxial growth process is used to grow a shared source region 804 on top of N+ common source connector region 806. Accordingly, shared source region 804 will form the source contact of the transistors that form PCM portion 200A, and N+ common source connector region 806 will connect shared source region 804 to N+ common source 206A.

Figure 9A:
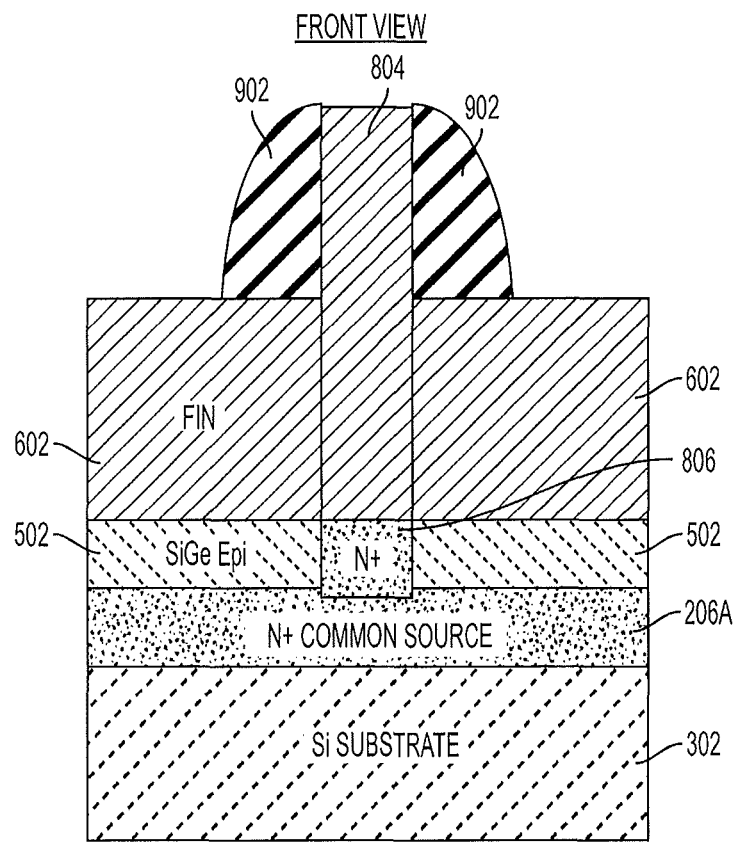
FIG. 9A depicts a two-dimensional, cut-away view of a front plane during an intermediate fabrication stage of a portion of a PCM memory having FinFET semiconductor devices according to one or more embodiments.
Figure 9B:
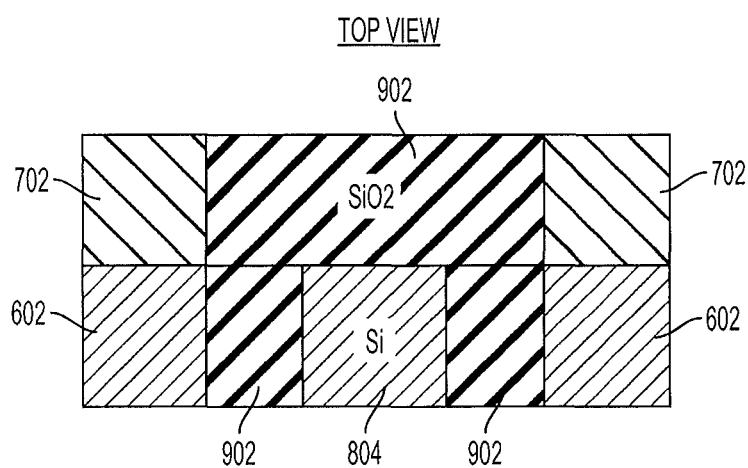
FIG. 9B depicts a two-dimensional, cut-away view of a top plane of the portion of the PCM memory semiconductor device shown in FIG. 9A.

In FIGS. 9A and 9B (block 1514 of methodology 1500), hard mask 802 has been removed, and offset spacers 902 are formed around the sidewalls of an exposed portion of shared source region 804, as shown. Offset spacers 902 may be formed using a spacer pull down formation process. Offset spacers 902 may also be formed using a sidewall image transfer (SIT) spacer formation process, which includes spacer material deposition followed by directional reactive-ion etching (RIE) of the deposited spacer material.

Figure 10A:
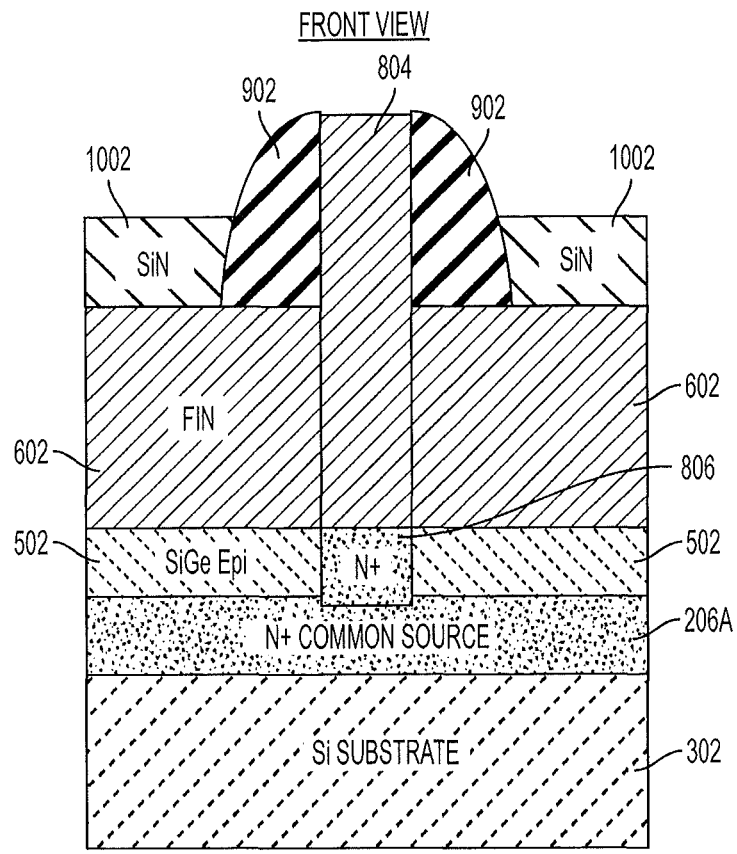
FIG. 10A depicts a two-dimensional, cut-away view of a front plane during an intermediate fabrication stage of a portion of a PCM memory having FinFET semiconductor devices according to one or more embodiments.
Figure 10B:
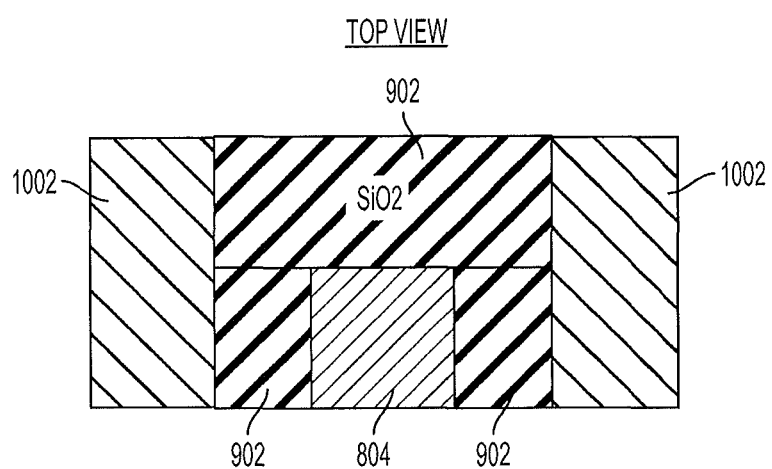
FIG. 10B depicts a two-dimensional, cut-away view of a top plane of the portion of the PCM memory semiconductor device shown in FIG. 10A.

In FIGS. 10A and 10B (block 1516 of methodology 1500), a nitride 1002 (e.g., SiN) is deposited over the exposed top portions of Si layer 602 and nitride 702. After deposition, nitride 1002 is recessed and polished using a chemical mechanical polish (CMP) operation to selectively remove nitride 1002, and a RIE operation to selectively recess nitride 1002 to a level that approximately one half the height of offset spacers 902.

Figure 11A:
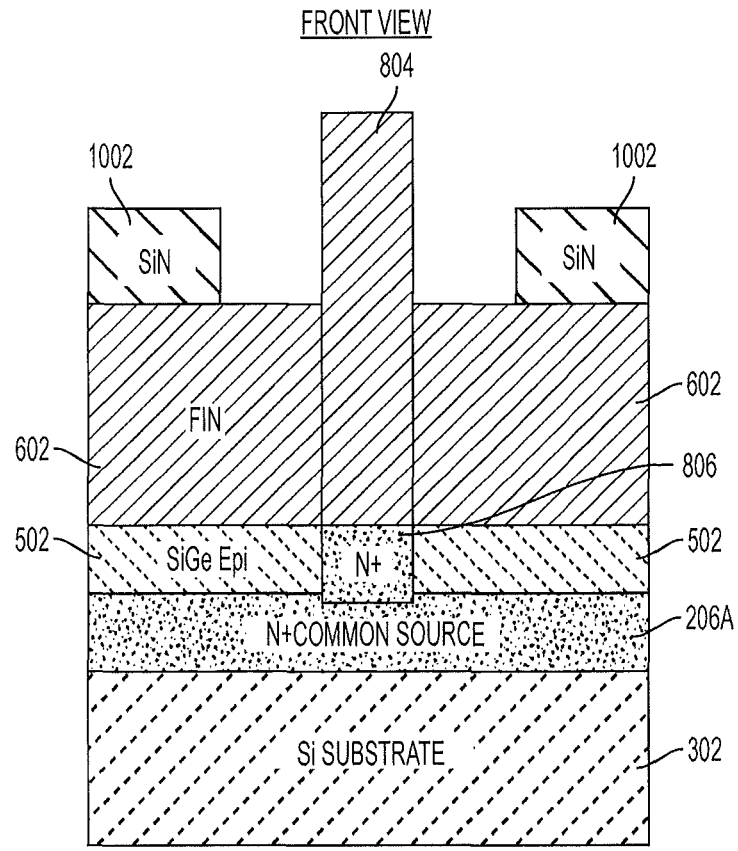
FIG. 11A depicts a two-dimensional, cut-away view of a front plane during an intermediate fabrication stage of a portion of a PCM memory having FinFET semiconductor devices according to one or more embodiments.
Figure 11B:
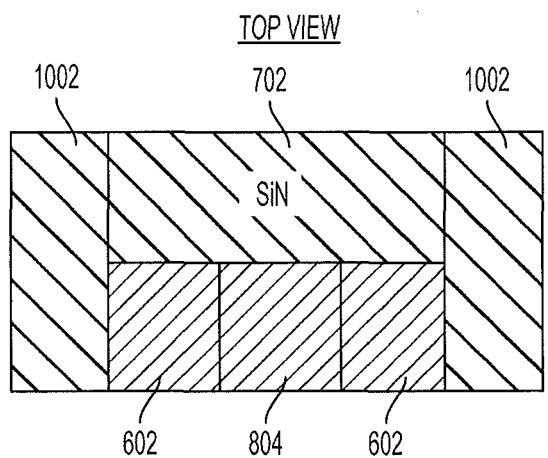
FIG. 11B depicts a two-dimensional, cut-away view of a top plane of the portion of the PCM memory semiconductor device shown in FIG. 11A.
Figure 12A:
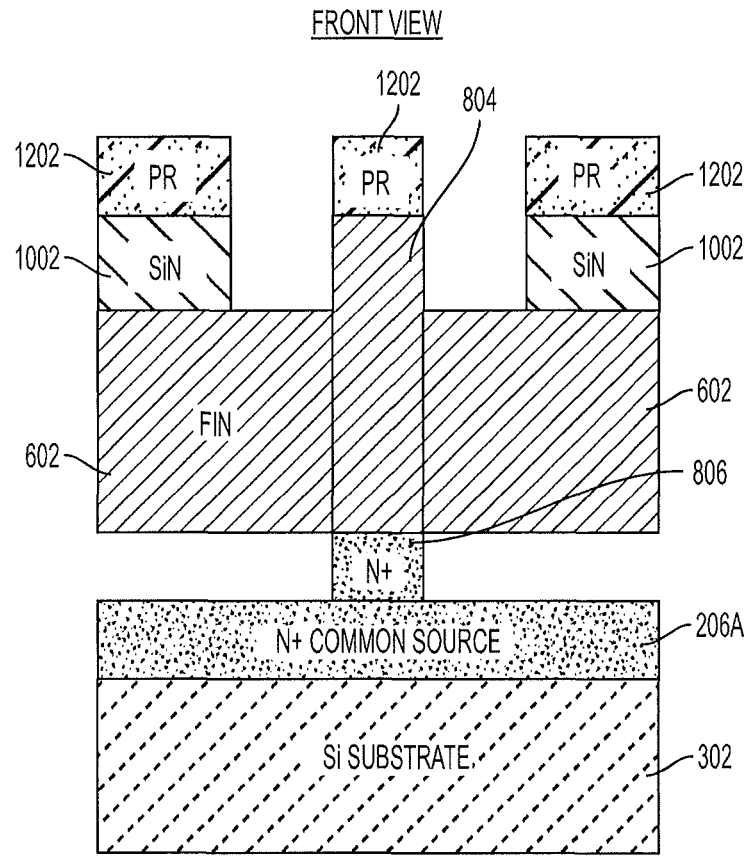
FIG. 12A depicts a two-dimensional, cut-away view of a front plane during an intermediate fabrication stage of a portion of a PCM memory having FinFET semiconductor devices according to one or more embodiments.
Figure 12B:
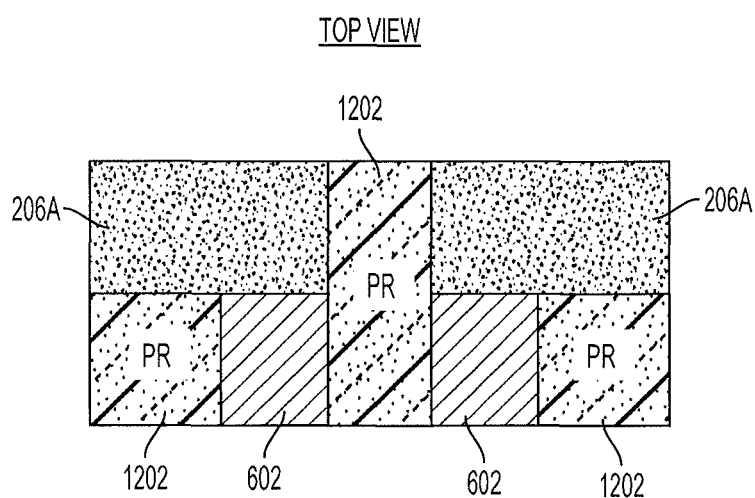
FIG. 12B depicts a two-dimensional, cut-away view of a top plane of the portion of the PCM memory semiconductor device shown in FIG. 12A.

In FIGS. 11A and 11B (block 1518 of methodology 1500), offset spacers 902 are removed. In FIGS. 12A and 12B (block 1520 of methodology 1500), a nitride (e.g., SiN) fill is applied with a stop on Si such that the topography of the device is filled out. A CMP is applied such that the topography of the device becomes planar. A photo-resist mask 1202 is patterned as shown, and an anisotropic etch that has a substantially slower etch rate for Si is performed to remove nitride layer 702 and portions of nitride layers 1002 down to N+ common source 206A while leaving Si layer 602 substantially un-etched. Sacrificial layer 502 is removed using, for example, a hydrochloric acid etch.

Figure 13A:
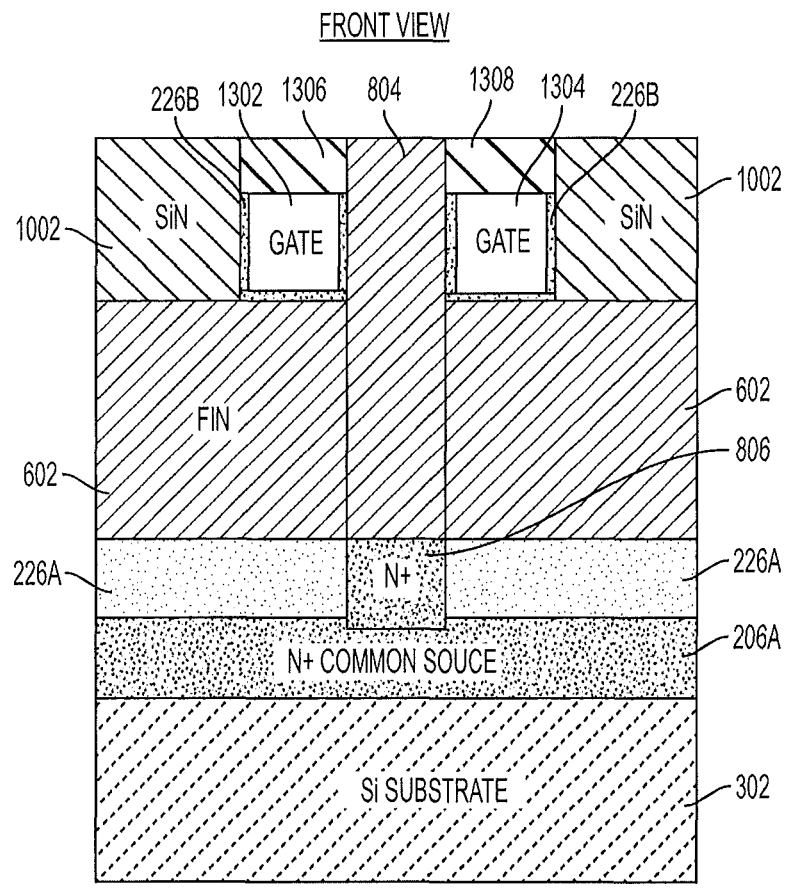
FIG. 13A depicts a two-dimensional, cut-away view of a front plane during an intermediate fabrication stage of a portion of a PCM memory having FinFET semiconductor devices according to one or more embodiments.
Figure 13B:
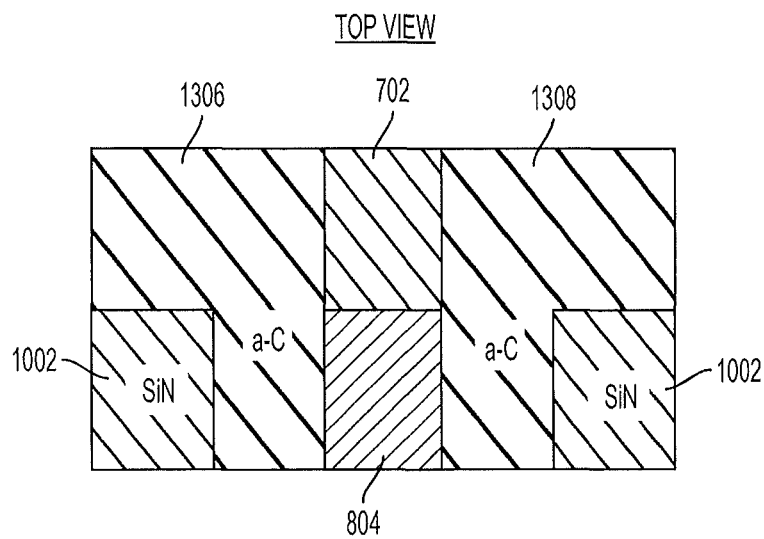
FIG. 13B depicts a two-dimensional, cut-away view of a top plane of the portion of the PCM memory semiconductor device shown in FIG. 13A.

In FIGS. 13A and 13B (block 1522 of methodology 1500), photo resist mask 1202 has been removed, and the device structure is backfilled with an oxide 226A to provide electrical isolation between the two transistors of PCM portion 200A (shown in FIGS. 14A and 14B). A CMP is applied such that the topology of the device is planarized back to the level of nitride 1002. Nitride 1002, Si layer 602 and shared source region 804 are then used as a mask for an anisotropic etch that has a substantially slower etch rate for Si and SiN to remove oxide 226A between nitride 1002 and shared source region 804 and along selected sections of the back portion of PCM portion 200A down to N+ common source 206A. A first gate region 1302 and a second gate region 1304 are formed in the space between nitride layers 1002 and shared source regions 804. First and second gate regions 1302, 1304 extend downward to wrap around portions of Si layer 602 that will become first and second fin/channel regions. In accordance with one or more embodiments of the present disclosure, first and second gate regions 1302, 1304 also extend laterally to wrap around portions of Si layer 602 that will become first and second drain pillar regions. In a gate-last fabrication process, first and second gate regions/structures 1302, 1304 are formed by depositing a dielectric material and gate metal. For example, a high-K (HK) dielectric material, e.g., hafnium based material, can be deposited to form a gate dielectric 226B. A metal liner, e.g., a work-function metal, and a gate metal can then be deposited on the dielectric material to complete the first and second gate formation. In one or more embodiments, the metal liner can be, for example, TiN or TaN, and the gate metal can be aluminum or tungsten. A first and a second layer of amorphous carbon (a-C) 1306, 1308 are deposited over first and second gate regions 1302, 1304, respectively, as capping layers.

In FIGS. 14A and 14B (block 1524 of methodology 1500), nitride layers 1002 are removed to open drain contacts, and an epitaxial growth is performed to form first drain contact 1402 and second drain contact 1404. N-type doping is applied through first drain contact 1402 and into Si layer 602 to along a gradient (from heavily doped to moderately doped) to form a first moderately doped drain pillar region 1408. N-type doping is also applied through second drain contact 1404 and into Si layer 602 along a gradient from heavily doped N+ to moderately doped) to form a second moderately doped drain pillar region 1410. N-type doping is also applied through shared source region 804 along a gradient (from heavily doped N+ to moderately doped) to form a shared source contact 1406 and a moderately doped shared source region 804A. As previously noted herein, when on the order of one dopant atom is added to a semiconductor material per 100 million atoms, the doping is said to be moderate or low or light. When many more dopant atoms are added to a semiconductor material, on the order of one per 10,000 atoms, the doping is referred to as heavy or high. Heavy doping is often shown as N+ for n-type doping or P+ for p-type doping.

Thus, it can be seen from the forgoing detailed description and accompanying illustrations that embodiments of the present disclosure provide FinFET device structures and fabrication methodologies, wherein a gate region of the FinFET is wrapped around moderately doped drain regions and/or source regions of the FinFET. The metal gate induces electrons and holes in the surface of adjacent silicon material when the metal gate is turned on, but does not induce electrons and holes in the surface of adjacent silicon material when the metal gate is turned off. These induced electrons and holes can serve as transport charges that reduce the resistance of the adjacent silicon material. Wrapping the metal gate around the moderately doped source/drain regions induces even more electrons and holes in the surface of adjacent silicon material when the metal gate is turned on, but still does not induce electrons and holes in the surface of adjacent silicon material when the metal gate is turned off. These additional induced electrons and holes can also serve as transport charges that even further reduce the resistance of the adjacent silicon material. Further, wrapping the metal gate around the moderately doped source/drain regions help to reducing series resistance leakage currents. In one or more embodiments, wrapping of gate around the source and drain is achieved by a fabrication methodology that adds only one extra oxide etching step before the replacement metal gate is deposited into the gate trench. According to one or more embodiments of the present disclosure, by wrapping the gate around the source and drain contacts, drive current is improved by two times or more for a given off-state leakage.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of forming portions of a fin-type field effect transistor (FinFET) device, the method comprising:
   forming at least one source region having multiple sides;
   forming at least one drain region adjacent the at least one source region, the at least one drain region having multiple sides;
   forming at least one channel region substantially between and below the at least one source region and the at least one drain region, the at least one channel region having multiple sides;
   forming at least one gate region:
      substantially above the at least one channel region;
      wrapped around a portion of the multiple sides of the at least one source region; and
      wrapped around the multiple sides of the at least one drain region; and
   forming a common source substrate.

2. The method of claim 1 further comprising coupling the common source substrate to the at least one source region.

3. The method of claim 1, wherein forming the at least one drain region comprises forming a drain contact region coupled to a drain pillar region.

4. The method of claim 3 further comprising doping the drain contact region and the drain pillar region.

5. The method of claim 4, wherein doping the drain contact region comprises doping the drain contact region to include a level of doping equal to approximately one dopant atom per 10,000 atoms.

6. The method of claim 4, wherein doping the drain pillar region comprises doping the drain pillar region to include a level of doping equal to approximately one dopant atom per 100,000,000 atoms.

7. A method of forming portions of a fin-type field effect transistor (FinFET) device, the method comprising:
   forming a first drain region having multiple sides;
   forming second drain region adjacent and separate from the first drain region, the second drain region having multiple sides;
   forming a shared source region between the first drain region and the second drain region, the shared source region having multiple sides;
   forming a first gate region around:
      the multiple sides of the first drain region; and
      a portion of the multiple sides of the shared source region;
   forming a second gate region around:
      the multiple sides of the second drain region; and
      a distinct portion of the multiple sides of the shared source region; and
   forming a common source substrate.

8. The method of claim 7 further comprising coupling the common source substrate to the shared source region.

9. The method of claim 7, wherein forming the first drain region comprises forming a drain contact region coupled to a drain pillar region.

10. The method of claim 9 further comprising doping the drain contact region and the drain pillar region.

11. The method of claim 10, wherein doping the drain contact region comprises doping the drain contact region to include a level of doping equal to approximately one dopant atom per 10,000 atoms.

12. The method of claim 10, wherein doping the drain pillar region comprises doping the drain pillar region to include a level of doping equal to approximately one dopant atom per 100,000,000 atoms.

13. The method of claim 7, further comprising:
   forming a first channel region on the common source substrate, the first channel region positioned between the common source substrate and the first drain region; and
   forming a second channel region on the common source substrate and adjacent the first channel region, the second channel region positioned between the common source substrate and the second drain region.

14. The method of claim 7, wherein forming the second gate region around the distinct portion of the multiple sides of the shared source region includes:

wrapping the second gate region around the entirety of the multiple sides of the shared region not covered by the first gate region.

15. A method of forming portions of a fin-type field effect transistor (FinFET) device, the method comprising:
- forming a first drain region having multiple sides;
- forming second drain region adjacent and separate from the first drain region, the second drain region having multiple sides;
- forming a shared source region between the first drain region and the second drain region, the shared source region having multiple sides;
- forming a first gate region around:
  - the multiple sides of the first drain region; and
  - a portion of the multiple sides of the shared source region; and
- forming a second gate region around:
  - the multiple sides of the second drain region; and
  - a distinct portion of the multiple sides of the shared source region,
- wherein forming the second gate region around the distinct portion of the multiple sides of the shared source region includes:
  - wrapping the second gate region around the entirety of the multiple sides of the shared region not covered by the first gate region.

* * * * *